United States Patent [19]

Suzuki

[11] Patent Number: 4,692,738

[45] Date of Patent: Sep. 8, 1987

[54] ANALOG SIGNAL PROCESSING APPARATUS

[75] Inventor: Seigo Suzuki, Tokyo, Japan

[73] Assignee: Kabushiki Kaisha Toshiba, Kawasaki, Japan

[21] Appl. No.: 711,382

[22] Filed: Mar. 13, 1985

[30] Foreign Application Priority Data

Mar. 14, 1984 [JP] Japan .................................. 59-48606

[51] Int. Cl.⁴ .......................... G06G 7/12; G06J 1/00; H03K 13/02
[52] U.S. Cl. ........................... 340/347 C; 340/347 M; 340/347 AD
[58] Field of Search ....... 340/347 M, 347 C, 347 AD; 364/602

[56] References Cited

U.S. PATENT DOCUMENTS

| | | | |
|---|---|---|---|
| 3,540,037 | 11/1970 | Ottesen | 340/347 C |
| 3,883,864 | 5/1975 | Thomas | 340/347 AD |
| 3,906,488 | 9/1975 | Suarez-Gartner | 340/347 C |
| 4,112,427 | 9/1978 | Höfer et al. | 340/347 C |
| 4,149,256 | 4/1979 | Sumi et al. | 340/347 M |
| 4,219,879 | 8/1980 | Judell | 340/347 M |
| 4,348,768 | 9/1982 | Svala | 340/347 C X |
| 4,373,189 | 2/1983 | Weant | 364/602 |
| 4,425,561 | 1/1984 | Whiteside et al. | 340/347 M |
| 4,431,987 | 2/1984 | Whiteside | 340/347 M |
| 4,532,494 | 7/1985 | Sasaki et al. | 340/347 AD |

OTHER PUBLICATIONS

Engineering Staff of Analog Devices, Inc., *Analog-Digital Conversion Handbook*, Jun. 1972, pp. I-85 and II-47.

Michael McGowan, "Processing Analog Signals Digitally on a Single Programmable Chip," Control Engineering, Oct. 1979, pp. 68-70.

Primary Examiner—William M. Shoop, Jr.
Assistant Examiner—Sharon D. Logan
Attorney, Agent, or Firm—Finnegan, Henderson, Farabow, Garrett & Dunner

[57] ABSTRACT

An analog signal is input to an A/D converting section. This A/D converting section has a D/A converter therein. The A/D converting section converts the input analog signal to a digital signal. A digital signal processing circuit receives an output signal from the A/D converting section and performs a predetermined process to this signal. A D/A converting section receives and converts an output signal of the digital signal processing circuit to an analog signal. This D/A converting section has a D/A converter with the same circuit arrangement as the D/A converter in the A/D converting section circuit and is constituted by the same circuit pattern. Therefore, the converting functions of the A/D converting section and of the D/A converting section are inverse functions of each other, so that error or distortion, which is caused in the A/D converting section, is automatically corrected when the digital signal is reconverted to the analog signal in the D/A converting section.

9 Claims, 13 Drawing Figures

F I G. 4A
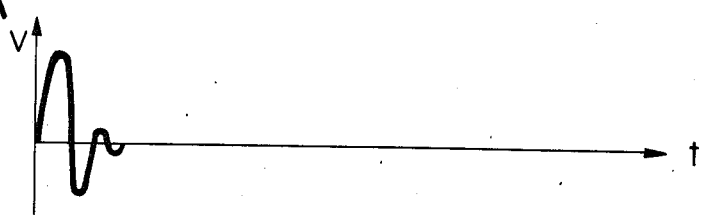
F I G. 4B
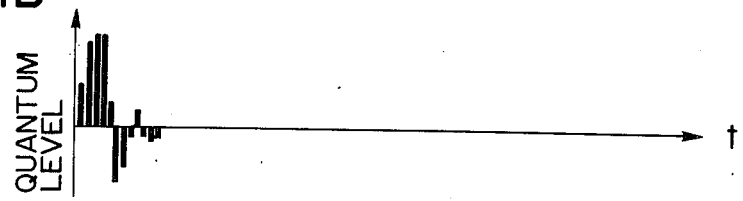
F I G. 4C
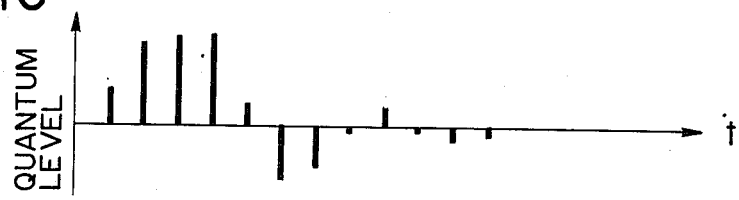
F I G. 5
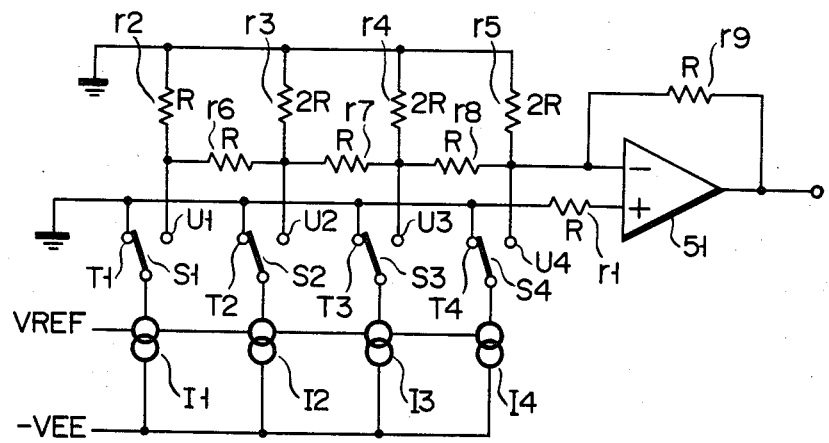

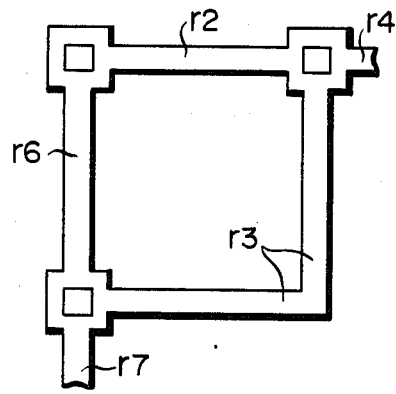
F I G. 6A
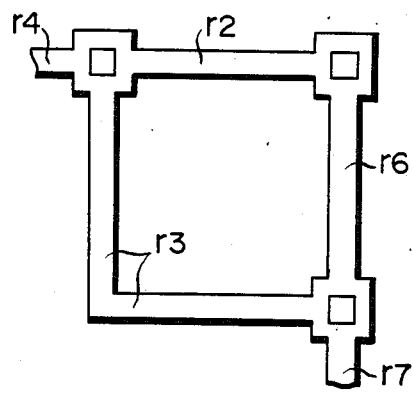
F I G. 6B
F I G. 7
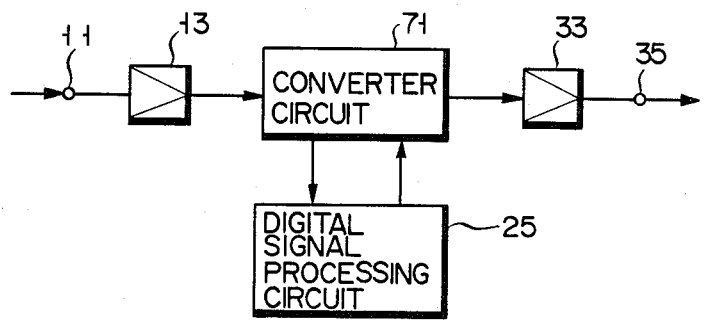

ANALOG SIGNAL PROCESSING APPARATUS

BACKGROUND OF THE INVENTION

The present invention relates to an improvement in an analog signal processing apparatus in which an analog signal is converted to a digital signal which is subjected to predetermined processes and thereafter is converted back to an analog signal. This analog signal is then provided as the output.

Recently, what is called a digital television has been developed and put into practical use. In this digital television, an analog signal such as a video signal or an audio signal is not subjected to an analog process as it is, but is converted to a digital signal. This digital signal is then subjected to various kinds of predetermined processes. The digital signal which was subjected to predetermined processes is reconverted to an analog signal, so that the R, G and B video signals, audio signals or the like are obtained. Namely, as shown in FIG. 1, an analog input signal such as a video signal, audio signal or the like is input to an A/D converter 1. The A/D converter 1 converts the input analog signal to the digital signal. A digital signal processing circuit 3 receives the digital signal from the A/D converter 1 and performs various kinds of processes such as a Y signal process, separation of a chrominance signal, synchronizing separation, discrimination of an audio signal, and the like to this digital signal. The digital signal which was subjected to the foregoing various kinds of processes is input to a D/A converter 5. The D/A converter 5 converts the input digital signal to an analog signal. In this way, the processed analog output signal such as a video signal, audio signal or the like is derived.

As described above, in the case of temporarily converting the analog signal to the digital signal and performing the digital signal processes, the following advantages are obtained as compared with the analog signal process without any A/D conversion. (1) The characteristics become stable. (2) The number of parts can be reduced. (3) The adjusting steps can be decreased. (4) Reliability is improved due to the use of an IC.

Conventionally, to improve accuracy in an analog signal processing apparatus as shown in FIG. 1, the performances of the A/D converter 1, digital signal processing circuit 3 and D/A converter 5 are improved and the A/D converter 1 and the D/A converter 5 have high accuracies. In addition, the digital signal processing circuit 3 executes the processes on the assumption that no error is included in the digital signal which is output from the A/D converter 1.

However, in the conventional analog signal processing apparatus shown in FIG. 1, the following drawbacks occur. (1) The highly accurate A/D converter 1 and D/A converter 5 are extremely expensive. Thus, the analog signal processing apparatus using highly accurate A/D and D/A converters (namely, a highly accurate analog signal processing apparatus) is very expensive. (2) In general, it is difficult to realize improvements in both the accuracy and the converting speeds of the A/D and D/A converters. Usually, in the case where the accuracies of the D/A converter and A/D converter are improved their operating speeds are lowered. Therefore, this results in a slower operating speed of the overall analog signal processing apparatus. (3) Even if the accuracies of individual parts are improved, it is impossible to correct the conversion error, distortion or the like based on the offset voltage which is developed in the A/D converter on the input side, or based on the nonlinearity of the conversion function, or the like. Thus, these conversion errors and distortions are output as incorrect signals. (4) In the case of constituting a highly accurate A/D converter and D/A converter, the bipolar technology is superior to the MOS technology in the present technology. On the other hand, with respect to the digital signal processing circuit, the MOS technology is superior to the bipolar technology. Therefore, there is technical difficulty in making the overall apparatus as one chip.

SUMMARY OF THE INVENTION

It is an object of the present invention to provide an inexpensive and highly accurate analog signal processing apparatus which can operate at a high speed and can be easily manufactured as one chip.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the analog signal processing apparatus of this invention comprises analog-to-digital converting means for receiving an analog input signal and converting said analog signal to a digital signal in accordance with a predetermined converting function and outputting the digital signal; digital signal processing means connected to said analog-to-digital converting means for receiving the output signal of said analog-to-digital converting means and performing a predetermined digital signal process to the output signal of said analog-to-digital converting means; and digital-to-analog converting means connected to said digital signal processing means for receiving and converting the output signal of said digital signal processing means to an analog signal in accordance with a converting function which is substantially equal to the inverse function of said converting function of said analog-to-digital converting means, thereby correcting error occurring when said analog-to-digital converting means converts the input analog signal to the digital signal.

This analog signal processing apparatus further comprises analog-to-digital converting means for receiving and converting an analog input signal to a digital signal in accordance with a predetermined converting function, and including a digital-to-analog converting circuit for converting a digital signal to an analog signal; digital signal processing means connected to analog-to-digital converting means for receiving an output signal of said analog-to-digital converting means and performing a predetermined digital signal process thereto; digital-to-analog converting means connected to said digital signal processing means for receiving and converting the output signal of said digital signal output means, and including said digital-to-analog converter circuit which is commonly shared with said analog-to-digital converting means so that a converting function of said digital-to-analog converting means becomes an inverse function of said converting function of said analog-to-digital converting means, said digital-to-analog converting means converting the output signal from said digital signal processing means to an analog signal in accordance with the converting function.

In the foregoing arrangement, the converting function of the analog-to-digital converting means is substantially equal to the inverse function of the converting function of the digital-to-analog converting means. Therefore, there are the following advantages. (1) The conversion error, distortion or the like which is caused when the analog signal is converted to the digital signal in the A/D converting means is corrected when the digital signal is converted to the analog signal by the D/A converting means. Therefore, a highly accurate analog signal processing apparatus can be easily obtained. (2) There is no need to respectively and individually make the accuracies of the analog-to-digital converting means and of the digital-to-analog converting means higher than they need be. Thus, if the accuracy in conversion of the overall apparatus is nearly the same as that of the conventional apparatus, the respective accuracies in conversion of the A/D converting means and of the D/A converting means may be lower than those of the conventional ones. Consequently, this results in an improvement in the operating speed of each of those converting means and the operating speed of the overall apparatus is accordingly improved. (3) Since it is unnecessary to respectively and individually make the conversion accuracies of the above-mentioned converting means higher than they need be, those converting means can be constituted by the preset MOS technology and, together with the digital signal processing means, the whole analog signal processing apparatus can be easily constituted in one chip as a MOS structure. By constituting such an apparatus as one chip, the characteristics can be further improved and the cost of this apparatus can be reduced. (4) Both converting means can be manufactured with a lower cost because they do not require a high accuracy in signal processing. Consequently, the overall apparatus can be manufactured inexpensively.

The accompanying drawings, which are incorporated in and constitute a part of this specification, illustrate embodiments of the invention and, together with the description, serve to explain the principles of the invention.

BRIEF DESCRIPTION OF THE DRAWINGS

FIGS. 4A and 4C are signal waveform diagrams for explaining the operation of the analog signal processing apparatus shown in FIG. 3;

FIG. 5 is a circuit diagram showing an example of an arrangement of a D/A converter;

FIGS. 6A and 6B are diagrams showing parts of patterns in the case where the circuit shown in FIG. 5 was patterned;

FIG. 7 is a block diagram showing an arrangement of an analog signal processing apparatus constructed according to the second embodiment of the invention;

DETAILED DESCRIPTION OF THE PREFERRED EMBODIMENTS

First, the principle of the present invention will be described.

Figure 1:
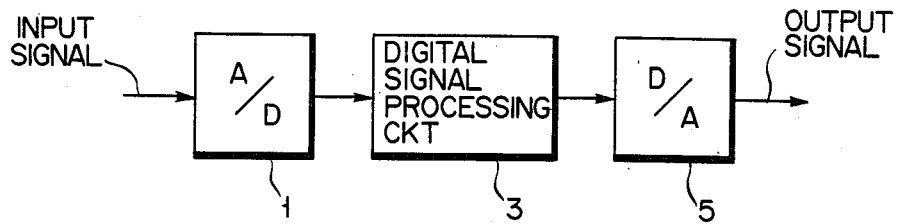
FIG. 1 is a block diagram showing an arrangement of a conventional analog signal processing apparatus.
Figure 2A:
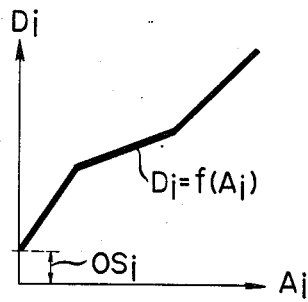
FIG. 2A is a graph showing the relation between an analog signal which is input to an A/D converter and a digital signal which is output therefrom.
Figure 2B:
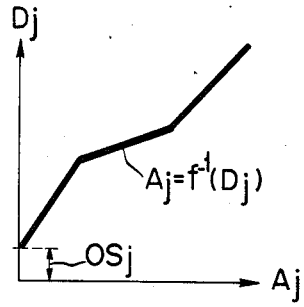
FIG. 2B is a graph showing the relation between a digital signal which is input to a D/A converter and an analog signal which is output therefrom.

An analog signal processing apparatus of the invention comprises the A/D converter 1, digital signal processing circuit 3 and D/A converter 5 similar to the conventional analog signal processing apparatus shown in FIG. 1. A feature of this invention is that the converting functions of the D/A converter 5 is the inverse function of the converting function of the A/D converter 1. The A/D converter 1 converts an input analog signal $A_i$ to a digital signal $D_i$ so that the analog signal $A_i$ which is input and the digital signal $D_i$ which is output satisfy a constant relation (converting function $(D_i=f(A_i)$, where f is a converting function). On the other hand, the D/A converter 5 converts a digital signal $D_j$ to an analog signal $A_j$ such that the digital signal $D_j$ which is input and the analog signal $A_j$ which is output satisfy the opposite relation as in the case of the A/D converter 1. Namely, the digital input signal $D_j$ and analog output signal $A_j$ satisfy the opposite relation $(A_j=f^{-1}(D_j)$, where $f^{-1}$ is a converting function of the D/A converter 5 and is the inverse function of the converting function f of the A/D converter 1; when this equation is rewritten, it becomes $D_j=f(A_j))$ as compared with the converting function of the A/D converter 1. For instance, the A/D converter 1 converts the input signal to the digital signal by a converting function represented by $D_i=f(A_i)$ as shown in FIG. 2A and with an offset voltage $OS_i$. On the other hand, the D/A converter 5 converts the input digital signal to the analog signal by a converting function represented by $A_j=f^{-1}(D_j)$ as shown in FIG. 2B (where $f^{-1}$ is the inverse function of the converting function f) and further with an offset voltage $OS_j$ which is the same as the offset voltage $OS_i$.

As described above, in the analog signal of the processing apparatus according to the present invention, there is the relation of the inverse functions with each other between the converting functions of the A/D converter 1 and D/A converter 5. Also, the offset voltages $OS_i$ and $OS_j$ have the same value. Therefore, the conversion error, distortion or the like which is caused in the A/D converter 1 is automatically canceled $(A_i=f(f^{-1}(A_i)))$ when the conversion is again performed by the D/A converter 5. However, in this case, the round off or the like upon quantization is ignored.

An analog signal processing apparatus according to the first embodiment of the present invention will be described with reference to the FIGS. 3, 4A, 4B, 4C. For explanation, it is assumed that the analog signal processing apparatus converts an analog audio signal compressed on the time base as shown in FIG. 4A to a digital signal as shown in FIG. 4B and converts this digital signal to a real time signal as shown in FIG. 4C by the digital signal process, and further it again converts the real time signal to the analog signal and outputs this analog signal.

An arrangement of the analog signal processing apparatus (FIG. 3) according to the first embodiment of the invention will be first explained. An analog input signal which should be processed by the analog signal processing apparatus is input to an input amplifier 13 through an input terminal 11. An output signal of the input amplifier 13 is input to an A/D converting section 15. For explanation, it is assumed that the A/D converting section 15 is what is called a feedback type A/D converter having a D/A converter therein and, in particular, it is an A/D converter of the successive approximation type among those converters. The A/D converting section 15 is constituted in a manner as follows. The output signal of the input amplifier 13 is input to a positive input terminal of a comparator 17. An output signal of the comparator 17 is input to an input terminal of a control unit 19. An output signal of the control unit 19 is input to a first latch 21. An output signal of the first latch 21 is input to an input terminal of a first D/A converter 23. An output signal of the D/A converter 23 is input to a negative input terminal of the comparator 17.

The output signal of the first latch 21 is input also to a digital signal processing circuit 25 as an output signal of the A/D converting section 15. The digital signal processing circuit 25 receives the output signal of the A/D converting section 15 and performs a predetermined process (extension of the time base in this case) to this output signal and then outputs a corresponding digital signal. An output signal of the digital signal processing circuit 25 is input to a D/A converting section 27. The D/A converting section 27 is constituted by a second latch 29 and a second D/A converter 31. In order to obtain the inverse relationship between the converting functions of the D/A converting section 27 and A/D converting section 15, the first and second D/A converters 23, 31 have the same converting function. The output signal of the digital signal processing circuit 25 is input to the second latch 29. An output signal of the second latch 29 is input to the second D/A converter 31. An output signal of the second D/A converter 31, namely, an output signal of the D/A converting section 27 is input to an output amplifier 33. An output signal of the output amplifier 33, that is, an output signal of this analog signal processing apparatus is output through an output terminal 35. The portion surrounded by a broken line 37 is constituted in one chip.

The operation of the analog signal processing apparatus shown in FIG. 3 will now be described with reference to FIGS. 4A to 4C.

The audio signal compressed on the time base shown in FIG. 4A is amplified by the input amplifier 13 and is input to the positive input terminal of the comparator 17. The output signal of the comparator 17 is input to the control unit 19. The control unit 19 allows the content of the first latch 21 to be increased when the output signal of the comparator 17 is at a level of, e.g., "1". On the contrary, when the output signal of the comparator 17 is at a level of "0", the control unit 19 permits the content of the first latch 21 to be decreased. The first D/A converter 23 converts the content of the first latch 21 to the analog signal and inputs this analog signal to the negative input terminal of the comparator 17. Consequently, when the content of the first latch 21 is larger than the digital value corresponding to the output analog signal of the input amplifier 13, the comparator 17 outputs a "0" level signal. Due to this, the controller 19 reduces the content of the first latch 21. On the other hand, when the content of the first latch 21 is smaller than the digital value corresponding to the output signal of the input amplifier 13, the comparator 17 outputs a "1" level signal. Thus, the controller 19 increases the content of the first latch 21. What is called a sequential comparing operation as discussed above is sequentially performed.

The content of the first latch 21 when the output signal of the first D/A converter 23 coincides with the output signal of the input amplifier 13 is output as the digital signal corresponding to the input analog signal. In this way, the input analog signal shown in FIG. 4A is quantized as indicated in FIG. 4B. The digital signal processing circuit 25 receives the output signal of the A/D converting section 15 and extends this signal on the time base and outputs it as the digital signal as shown in FIG. 4C. The second latch 29 latches this digital signal. The second D/A converter 31 converts the content of the second latch 29 to the analog signal. In this case, since the converting functions of the first D/A converter 23 and the second D/A converter 31 are the same, the error or distortion which is caused in the A/D converting section 15 is automatically corrected. The output signal of the second D/A converter 31 is amplified by the output amplifier 33 and is output through the output terminal 35.

For explanation, it is assumed that the first D/A converter 23 in the A/D converting section 15 outputs the analog signal having the offset voltage corresponding to the digital signal "1". For instance, it is assumed that when the digital signal "10" is inputted, the first D/A converter 23 outputs the analog signal corresponding to the digital signal "11". On the other hand, since the converting function of the second D/A converter 31 is the same as the converting function of the first D/A converter 23, the output analog signal of the second D/A converter 31 is also output as the analog signal having the offset voltage responsive to the digital signal "1". For example, it is now assumed that the input analog signal corresponds to the digital signal "1010". In this case, when the content of the first latch 21 is "1001", the first D/A converter 23 outputs the analog signal corresponding to the digital signal "1010". Thus, the two input signals of the comparator 17 coincide. Therefore, the digital signal "1001" is output from the A/D converting section 15. On one hand, even if the time base is changed, the content of the digital signal "1001" is not changed. Therefore, the second latch 29 latches the digital signal "1001". As described above, the second D/A converter 31 outputs the analog signal having the offset voltage corresponding to the digital signal "1". This allows the second D/A converter 31 to output the analog signal responsive to the digital value "1010". In this way, the error caused in the A/D converting section 15 is automatically canceled when the conversion is performed in the D/A converting section 27, so that an accurate analog signal is output.

In the foregoing embodiment, the case where the D/A converters 23 and 31 output the analog signals having offset voltages has been described. However, the kinds of error are not limited to this. For example, conversion error, distortion or the like based on the non-linearity of the converting functions of the D/A converters can be also corrected.

In addition, in the foregoing embodiment, the case where the analog signal processing apparatus extends the analog signal compressed on the time base and outputs it, has been explained. However, the invention is not limited to this. For instance, the invention is also effective in the case, of apparatuses which interpolate, compensate or correct the drop out, instantaneous burst, error or masking due to large noise, of the input analog signal. Also, the invention is not limited to these apparatuses. The invention can be also applied to any kinds of analog signal processing apparatuses if they are the analog signal processing apparatuses which convert the analog signal to the digital signal and perform predetermined processes to this digital signal.

In the foregoing embodiment, the case where the successive approximation type A/D converter among so-called feedback type A/D converters is used as the A/D converting section 15 has been described. However, the invention is not limited to such an A/D converter. For instance, it is obvious that the invention can be likewise implemented even in case of using what is called a servo-balancing type A/D converter. Also, the invention is not limited to what is called a feedback type A/D converter.

In the foregoing embodiment, the converting functions of the D/A converters 23 and 31 are made equal so that the converting function of the A/D converting section 15 is the inverse function of the converting function of the D/A converting section 27. In order to make the converting functions of the D/A converters 23 and 31 equal, the circuit arrangement of the D/A converters 23 and 31 may be made identical. For example, in the case of using a D/A converter of a circuit arrangement shown in FIG. 5 as the first D/A converter 23, a converter having the same circuit arrangement as that of FIG. 5 is also used as the second D/A converter 31.

The D/A converter shown in FIG. 5 is what is called a ladder type D/A converter and is constituted in the following manner. Switches S1 to S4 are provided corresponding to the bits (the first to fourth bits) of the input digital signal, respectively. The switches S1 to S4 are connected to current input terminals of constant current sources I1 to I4, respectively. A power source voltage −VEE is connected to current output terminals of the constant current sources I1 to I4. A reference voltage VREF is supplied to the constant current sources I1 to I4. When the corresponding bits are "0", the switches S1 to S4 come into contact with terminals T1 to T4, respectively. On the other hand, when the corresponding bits are "1", the switches S1 to S4 come into contact with terminals U1 to U4, respectively.

The terminals T1 to T4 are connected to the ground and are further connected through a resistor r1 a positive input terminal of an amplifier 51. One end of resistors r2 to r5 is connected to the ground. In addition, the other end of the resistor r2 and one end of a resistor r6 are connected to the terminal U1. The other end of the resistor r3, the other end of the resistor r6 and one end of a resistor r7 are connected to the terminal U2. The other end of the resistor r4, the other end of the resistor r7 and one end of a resistor r8 are connected to the terminal U3. The other end of the resistor r5 and the other end of the resistor r8 are connected to the terminal U4 and to a negative input terminal of the amplifier 51. Further, the negative input terminal of the amplifier 51 and its output terminal are connected through a resistor r9. The analog output signal is derived as the output signal of the amplifier 51. The resistance values of the resistors r1, r2, r6, r7, r8, and r9 are R and the resistance values of the resistors r3, r4 and r5 are 2R.

Further, the converting functions of the first D/A converter 23 and second D/A converter 31 can be coincident by making the circuit patterns of these circuits identical when producing ICs of these circuits. For instance, it is assumed that the circuit shown in FIG. 5 is used as the first D/A converter 23 and the circuit patterns of the resistors r2, r6 and r3 are constituted as shown in FIG. 6A. Due to this, as shown in FIG. 6B, the circuit pattern of the second D/A converter 31 is constituted as the pattern which is axially symmetrical with the circuit pattern shown in, for example, FIG. 6A. It is apparent to use substantially the same circuit pattern instead of the axial symmetry. On one hand, although only a part of the circuit has been drawn and described for understanding, it is desirable to make the circuit patterns of the overall circuit identical. As mentioned above, making the circuit patterns identical enables the converting functions of the D/A converters 23 and 31 to be similar. Moreover, it is possible to constitute the converting functions of the A/D converting section 15 and D/A converting section 27 as the inverse functions of each other.

The converting function of the A/D converting section 15 is the inverse function of the converting function of the D/A converting section 27, so that the conversion error or distortion caused in the A/D converting section 15 is automatically corrected when the D/A conversion is executed by the D/A converting section 27. Thus, (1) even if converters of lower accuracy than conventional ones are used as the A/D converting section 15 and D/A converting section 27, the conversion error of the overall apparatus is smaller than that in the conventional apparatus. Namely, a highly accurate analog signal processing apparatus can be obtained. (2) There is no need to make the accuracies of the A/D converting section 15 and D/A converting section 27 high, so that the cost of the whole analog signal processing apparatus can be reduced. (3) Since there is no need to make the accuracies of the A/D converting section 15 and D/A converting section 27 themselves too high, even if the accuracy of the overall apparatus is set to be nearly the same as that in the conventional apparatus, the speed of the converting operations of both converting sections 15 and 27 can be increased. (4) Since it is unnecessary to make the accuracies of the A/D converting section 15 and D/A converting section 27 high, these converting sections can be constituted as MOS arrangements. Therefore, the whole circuit including the digital signal processing circuit 25 can be constituted in a MOS arrangement. Thus, it is possible to easily constitute the overall apparatus indicated by the broken line in FIG. 3 as one chip. By making the circuit as one chip, the circuit arrangement can be made further uniform, so that it is possible to provide a cheaper analog signal processing apparatus in which the characteristic is excellent and the operation is easy.

Figure 3:
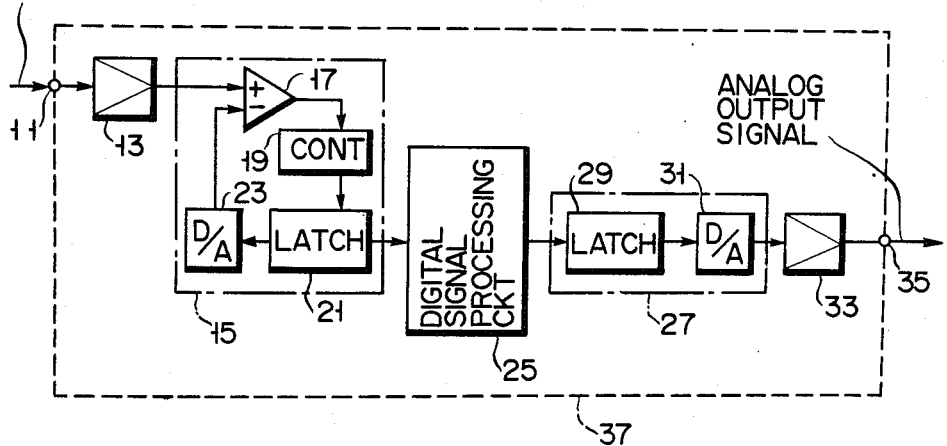
FIG. 3 is a block diagram showing an arrangement of an analog signal processing apparatus constructed according to the first embodiment of the present invention.

An analog signal processing apparatus according to the second embodiment of the present invention will now be described, in which the similar parts and components as those in the circuit shown in FIG. 3 are designated by the same reference numerals and their descriptions are omitted.

In the foregoing first embodiment, the A/D converting section 15 and D/A converting section 27 are independently provided. However, in the second embodiment, a converter circuit 71 having the A/D converting and D/A converting functions is provided as shown in FIG. 7. The input analog signal is converted to the digital signal by the converter circuit 71 and is input to the digital signal processing circuit 25. After the digital signal was subjected to predetermined processes by the processing circuit 25, it is again input to the converter circuit 71 and is converted to the analog signal.

Figure 8:
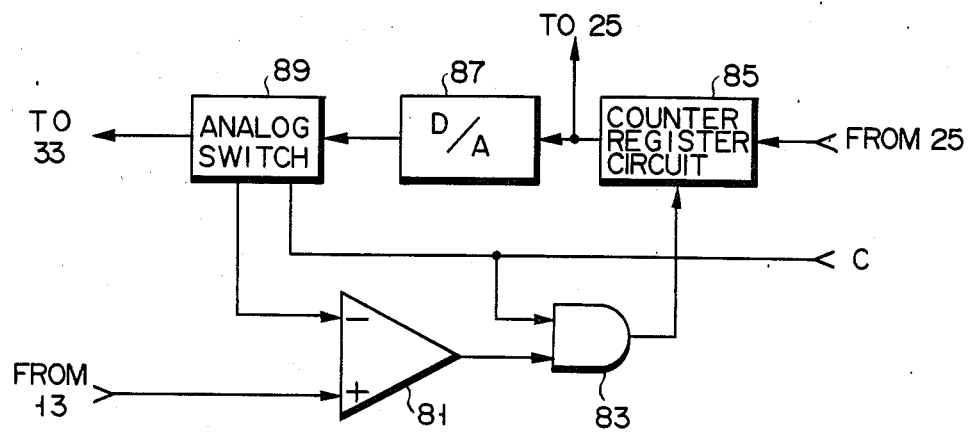
FIG. 8 is a block diagram showing an arrangement of the converter circuit shown in FIG. 7.

FIG. 8 is a block diagram showing an example of an arrangement of the converter circuit 71 of FIG. 7. The arrangement of this circuit will be first explained. In FIG. 8, the analog signal which should be processed by this analog signal processing apparatus is inputted to a positive input terminal of a comparator 81 through the terminal 11 and amplifier 13. An output signal of the comparator 81 is input to one input terminal of an AND gate 83. An output signal of the AND gate 83 is input to a counter register circuit 85. The counter register circuit 85 further receives the output signal of the digital signal processing circuit 25. An output signal of the counter register circuit 85 is input to a D/A converter 87. An output signal of the D/A converter 87 is input to an analog switch circuit 89 having a sampling/holding function. This analog switch circuit inputs an output signal of the D/A converter 87 to a negative input terminal of the comparator 81 when the converter circuit 71 operates as the A/D converter. On the other hand, the analog switch circuit 89 outputs the output signal of the D/A converter 87 to the amplifier 33 as the output signal of the converter circuit 71 when the converter circuit 71 operates as the D/A converter, A control signal C to control the change-over of the operation as the D/A converter or A/D converter of the converter circuit 71 is input to the analog switch 89 and to the other input terminal of the AND gate 83. This control signal C is supplied from the outside of the apparatus or from the digital signal processing circuit 25 or the like.

The operation will now be described. In order to make the converter circuit 71 shown in FIG. 8 operative as the A/D converter, the control signal C is set at a "1" level. Due to this, the AND gate 83 is opened. Also, the analog switch 89 allows the output signal of the D/A converter 87 to be input to the negative input terminal of the comparator 81. Thus, the analog signal corresponding to the content of the counter register circuit 85 and the output signal of the input amplifier 13 are compared. Due to this, when the content of the counter register circuit 85 is larger than the output signal of the amplifier 13, the comparator 81 outputs a "0" level signal and the AND gate 83 also outputs a "0" level signal. In response to this "0" level signal, the content of the counter register circuit 85 is reduced. On the contrary, when the content of the counter register circuit 85 is smaller than the output signal of the amplifier 13, the comparator 81 outputs a "1" level signal and the AND gate 83 also outputs a "1" level signal. In response to this "1" level signal, the content of the counter register circuit 85 is increased. In a similar manner as above, what is called a sequential comparing operation is repeatedly performed. The output signal of the counter register circuit 85 when the values of the two input signals of the comparator 81 coincide is input to the digital signal processing circuit 25 as the output signal of the converter circuit 71.

On the other hand, in order to make the converter circuit 71 in FIG. 8 operative as the D/A converter, the control signal C is set at a "0" level. Thus, the AND gate 83 is closed. The analog switch circuit 89 allows the output signal of the D/A converter 87 to be outputted to the output amplifier 33 as the output signal of the converter circuit 71. When the signal is input from the digital signal processing circuit 25 to the counter register circuit 85 in this state, the content of the counter register circuit 85 becomes equal to the digital signal from the digital signal processing circuit 25. Thus, the analog signal corresponding to the output signal of the digital signal processing circuit 25 is output from the D/A converter 87 and this analog signal is output to the output amplifier 33.

Figure 9:
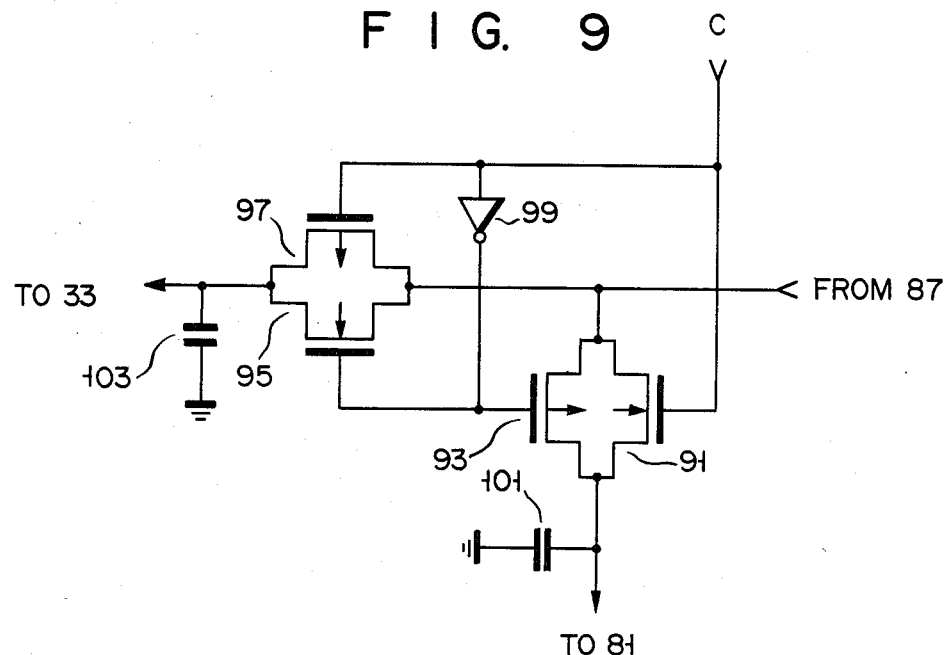
FIG. 9 is a circuit diagram showing an arrangement of the analog switch shown in FIG. 8.

FIG. 9 is a circuit diagram showing an example of a circuit arrangement of the analog switch circuit 89 in FIG. 8. The analog switch circuit 89 is constituted in the following manner. One end of the current path of an n-type CMOS transistor 91 is connected to one end of the current path of a p-type CMOS transistor 93. The other ends of those current paths are likewise connected to each other. Similarly, one end of the current path of an n-type CMOS transistor 95 is connected to one end of the current path of a p-type CMOS transistor 97. The other ends of those current paths are also connected to each other. The output signal of the D/A converter 87 is input to one end of the current path of the pair of transistors 91 and 93 and to one end of the current path of the pair of transistors 95 and 97. The control signal C is supplied to a gate of the n-type CMOS transistor 91 and to a gate of the p-type CMOS transistor 97. The control signal C is supplied through an inverter 99 to a gate of the p-type CMOS transistor 93 and to a gate of the n-type CMOS transistor 95. A capacitor 101 for sampling/holding is connected between ground and the connecting point of the other ends of the current paths of the transistors 91 and 93. Further, this connecting point is connected to the negative input terminal of the comparator 81. Similarly, a capacitor 103 for sampling/holding is connected between ground and the connecting point of the other ends of the current paths of the transistors 95 and 97. Further, this connecting point is connected to the input terminal of the output amplifier 33.

In this embodiment, the D/A converter 87 is commonly used when the converter circuit 71 performs the D/A conversion or A/D conversion; therefore, it is possible to provide the relation of inverse functions between the converting function upon the A/D conversion and the converting function upon the D/A conversion in this converter circuit 71. Therefore, the error which is caused when the input analog signal is converted to the digital signal can be corrected when the digital signal is again converted to the analog signal more accurately than in the first embodiment. Therefore, there is no need to make the accuracy of the converter circuit itself, particularly the D/A converter, as high as in the conventional apparatus. Consequently it is possible to obtain a highly accurate, inexpensive and high speed analog signal processing apparatus, constituted as one chip.

What is claimed is:

1. An analog signal processing apparatus comprising:
   analog-to-digital converting means for receiving an analog input signal and converting said analog signal to a digital signal in accordance with a predetermined converting function and outputting the digital signal;
   digital signal processing means connected to said analog-to-digital converting means for receiving the output digital signal of said analog-to-digital converting means and performing a predetermined digital signal process upon the output digital signal of said analog-to-digital converting means; and digital-to-analog converting means, connected to said digital signal processing means and separate from said analog-to-digital converting means, for receiving and converting the output digital signal of said digital processing means to an output analog signal in accordance with a converting function which is substantially equal to the inverse function of said converting function of said analog-to-digital converting means;

said analog-to-digital converting means represented by the relationship:

$$D_1 = f(A_i)$$

in which $A_i$ is the analog input signal, $D_i$ is the digital output signal, and f is the converting function; and said digital-to-analog converting means represented by the relationship:

$$A_j = f^{-1}(D_j)$$

in which $D_j$ is the output digital signal of the digital signal processing means, $A_j$ is the output analog signal, and $f^{-1}$ is the converting function substantially equal to the inverse of the converting function f; thereby correcting error occuring when said analog-to-digital converting means converts the input analog signal to the digital signal.

2. An analog signal processing apparatus according to claim 1, wherein said analog-to-digital converting means includes a digital-to-analog converting circuits, whereby in order to make the converting function of said digital-to-analog converting means equal the inverse function of the converting function of said analog-to-digital converting means, the converting function of said digital-to-analog converting circuit is set to be substantially identical to the converting function of said digital-to-analog converting means.

3. An analog signal processing apparatus according to claim 2, wherein said digital-to-analog converting means also includes a digital-to-analog converting circuit, and in order to make the converting function of said digital-to-analog circuit in said digital-to-analog converting means equal the converting function of said digital-to-analog converting circuit in said analog-to-digital converting means, the circuit arrangement of said two digital-to-analog converting circuits are made identical.

4. An analog signal processing apparatus according to claim 3, wherein said digital-to-analog converting circuits are constituted as patterns on an integrated circuit and in order to make the converting functions of said digital-to-analog converting circuits equal, the circuit patterns are made identical to each other.

5. An analog signal processing apparatus according to claim 1, wherein said analog-to-digital converting means, said digital signal processing means and said digital-to-analog converting means are constituted by MOS structures.

6. An analog signal processing apparatus according to claim 1, wherein said analog signal processing apparatus is constituted in one chip.

7. An analog signal processing apparatus according to claim 2, wherein said analog-to-digital converting means is of the successive approximation type.

8. An analog signal processing apparatus according to claim 2, wherein said analog-to-digital converting means is of the servo-balancing type.

9. An analog signal processing apparatus comprising:

analog-to-digital converting means for receiving an analog input signal and converting said analog signal to a digital signal in accordance with a predetermined converting function and outputting the digital signal, said analog-to-digital converting means represented by the relationship:

$$D_i = f(A_i)$$

in which $A_i$ is the analog input signal, $D_i$ is the digital output signal, and f is the converting function;

digital signal processing means connected to said analog-to-digital converting means for receiving the output digital signal of said analog-to-digital converting means and performing a predetermined digital signal process upon the output digital signal of said analog-to-digital converting means;

digital-to-analog converting means, connected to said digital signal processing means and separate from said analog-to-digital converting means, for receiving and converting the output digital signal of said digital signal processing means to an output analog signal in accordance with a converting function which is substantially equal to the inverse function of said converting function of said analog-to-digital converting means, said digital-to-analog converting means represented by the relationship:

$$A_j = f^{-1}(D_j)$$

in which $D_j$ is the output digital signal of the digital signal processing means, $A_j$ is the output analog signal, and $f^{-1}$ is the converting function substantially equal to the inverse of the converting function f;

and wherein said analog-to-digital converting means includes a first digital-to-analog converting circuit, said digital-to-analog converting means includes a second digital-to-analog converting circuit, and whereby in order to make the converting function of said digital-to-analog converting means substantially equal to the inverse function of the converting function of said analog-to-digital converting means, the circuit arrangement of said first and second digital-to-analog converting circuits are made identical;

said first and second digital-to-analog converting circuits being constituted as patterns on an integrated circuit, said patterns being made identical to each other; thereby correcting error occuring when said analog-to-digital converting means converts the input analog signal to the digital signal.

* * * * *